United States Patent
Granig et al.

(10) Patent No.: US 9,846,191 B2
(45) Date of Patent: Dec. 19, 2017

(54) SYSTEMS AND METHODS FOR INTERNAL AND EXTERNAL ERROR DETECTION IN SENSOR OUTPUT INTERFACES

(71) Applicant: Infineon Technologies AG, Neubiberg (DE)

(72) Inventors: Wolfgang Granig, Seeboden (AT); Harald Witschnig, Landskron (AT); Andrea Morici, Villach (AT)

(73) Assignee: Infineon Technologies AG, Neubiberg (DE)

( * ) Notice: Subject to any disclaimer, the term of this patent is extended or adjusted under 35 U.S.C. 154(b) by 1082 days.

(21) Appl. No.: 14/021,059

(22) Filed: Sep. 9, 2013

(65) Prior Publication Data
US 2015/0070042 A1 Mar. 12, 2015

(51) Int. Cl.
*G01R 31/26* (2014.01)
*G01D 21/00* (2006.01)
*G06F 17/40* (2006.01)
*G06F 19/00* (2011.01)
*G01R 31/28* (2006.01)
*G01R 31/36* (2006.01)
*G01D 3/036* (2006.01)

(52) U.S. Cl.
CPC ......... *G01R 31/2851* (2013.01); *G01D 3/036* (2013.01); *G01R 31/2829* (2013.01); *G01R 31/36* (2013.01); *G01D 21/00* (2013.01); *G06F 17/40* (2013.01); *G06F 19/00* (2013.01)

(58) Field of Classification Search
None
See application file for complete search history.

(56) References Cited

U.S. PATENT DOCUMENTS

| | | | | |
|---|---|---|---|---|
| 2,883,255 A | * | 4/1959 | Anderson | B41J 11/36 340/518 |
| 3,082,374 A | * | 3/1963 | Buuck | F41G 7/005 324/73.1 |
| 4,476,437 A | * | 10/1984 | Fujiwara | H03G 3/3042 330/138 |
| 5,422,965 A | * | 6/1995 | Bekki | B60R 21/0132 280/735 |
| 5,424,584 A | * | 6/1995 | Matsuda | B60R 21/0173 280/735 |

(Continued)

FOREIGN PATENT DOCUMENTS

| | | |
|---|---|---|
| CN | 2641295 Y | 9/2004 |
| CN | 201307061 Y | 9/2009 |
| CN | 102236353 A | 11/2011 |

OTHER PUBLICATIONS

Infineon Technologies AG, TLE4997: *Programmable Linear Hall Sensor*, Data Sheet, vol. 2.08, Sep. 2008, 34 pages.

*Primary Examiner* — Edward Cosimano
(74) *Attorney, Agent, or Firm* — Eschweiler & Potashnik, LLC

(57) ABSTRACT

Integrated circuit systems, such as sensor systems, having on-board-diagnostic (OBD) circuits for the detection of errors presenting internal to the systems are disclosed, along with related methods. In one embodiment, an ADC multiplexer receives analog output readback from an output driver and provides a signal triggering an OBD circuit for internal error indication performed completely independent of digital-to-analog converters (DAC) and output drivers, which can be the point of failure.

20 Claims, 3 Drawing Sheets

(56) References Cited

U.S. PATENT DOCUMENTS

| | | |
|---|---|---|
| 7,683,626 B2 | 3/2010 | Ausserlechner |
| 8,050,816 B2 * | 11/2011 | Doll ................. B60T 8/885 |
| | | 701/29.8 |
| 2007/0150136 A1 * | 6/2007 | Doll ................. B60T 8/885 |
| | | 701/29.2 |
| 2009/0277244 A1 * | 11/2009 | Doll ................. B60T 8/885 |
| | | 73/1.37 |
| 2012/0059506 A1 | 3/2012 | Okita et al. |
| 2013/0200909 A1 | 8/2013 | Rasbornig et al. |
| 2015/0108971 A1 * | 4/2015 | Granig ............. G01R 33/091 |
| | | 324/252 |

* cited by examiner

SYSTEMS AND METHODS FOR INTERNAL AND EXTERNAL ERROR DETECTION IN SENSOR OUTPUT INTERFACES

TECHNICAL FIELD

Embodiments relate generally to sensor output interfaces and more particularly to sensor output interfaces implementing On-Board-Diagnostic (OBD) circuits to detect errors or failures both external and internal to the sensor by using analog output readback techniques.

BACKGROUND

Sensors and sensor systems implemented in integrated circuits (ICs) often have analog output interfaces for communicating sensor signals to other system components, such as an electronic control unit (ECU) or other device in, e.g., automotive applications. Analog output interfaces often comprise digital-to-analog converters (DAC) and output drivers such that the output voltage from the driver is communicated external to the device via a conductor. In the event of a line interruption in the external conductor, for example, a break in the conductor itself, the output could be floating or other undesirable or even damaging errors can occur. Thus, on-board diagnostic (OBD) components can be implemented in the sensor systems to detect external line interruptions like this.

In one configuration, two OBD circuits are provided within an IC. The first OBD circuit is coupled between the output of the analog output interface and the terminal for supply potential $V_{DD}$, and the second OBD circuit is coupled between the output and the terminal for a negative supply potential or reference-ground potential GND. The OBD circuit essentially is a switch, comprising, e.g., a depletion transistor, and is normally open when the IC is operating correctly. In the event of an external fault, such as a line interruption that causes the IC to lose power, the OBD circuit closes and forms a short circuit such that the output signal is pulled towards $V_{DD}$ or GND to indicate an error.

Conventional sensors commonly provide diagnostics by defining OBD diagnostic output values or clamping ranges such that the operating range of the analog output is reduced, for example, to 10% to 90% $V_{DD}$. This disadvantageously limits the external output signal level. Additionally, certain safety requirements, for example, Automotive Safety Integrity Level (ASIL) standards, provide for diagnostics of internal functionalities. In order to fulfill these requirements, it is typical to define expanded diagnostic output values or clamping ranges so that the operating range of the analog output is further reduced, for example, 20% to 80% $V_{DD}$, resulting in a more reduced output signal level which can be a significant disadvantage. Another disadvantage is that if a failure occurs internal to the analog output interface itself, possibly due to failure of the DAC or output driver, the diagnostic output value or clamping range is no longer transmitted. This also can significantly reduce the diagnostic coverage since the output stage often needs a significant chip area in order to provide safety diagnostics for all or at least critical ones of the IC components.

In many applications, there is a general need for a sensor that is able to detect errors internal, as well as external, to the sensor. A drawback of some conventional approaches, then, is the limiting of the remaining signal level. A further drawback of conventional approaches is the dependence on the DAC and output driver such that failure in the DAC or output driver results in the non-transmission of the clamping range. A further disadvantage in conventional sensors that provide internal detection error is the number of additional components needed to provide diagnostic capabilities, thus increasing the size, cost, and complexity of the circuit.

SUMMARY

Embodiments relate to integrated circuit systems and methods comprising on-board-diagnostic circuits for detecting errors occurring within or external to the systems.

In an embodiment, an integrated circuit system comprises at least one on-board diagnostic circuit; an output driver providing a system output signal; and a control unit coupled to the at least one on-board diagnostic circuit and configured to compare the system output signal with a value and to provide an error output signal via the at least one on-board diagnostic circuit when the comparison indicates an error.

In an embodiment, a method of detecting errors internal to an integrated circuit system comprises providing an output signal of the system to an internal control circuit of the system; comparing the output signal to a value; and providing an error signal indicative of an error internal to the system via an on-board-diagnostic circuit if the comparing deviates from the value by a predefined limit.

BRIEF DESCRIPTION OF THE DRAWINGS

The invention may be more completely understood in consideration of the following detailed description of various embodiments of the invention in connection with the accompanying drawings, in which.

Figure 1:
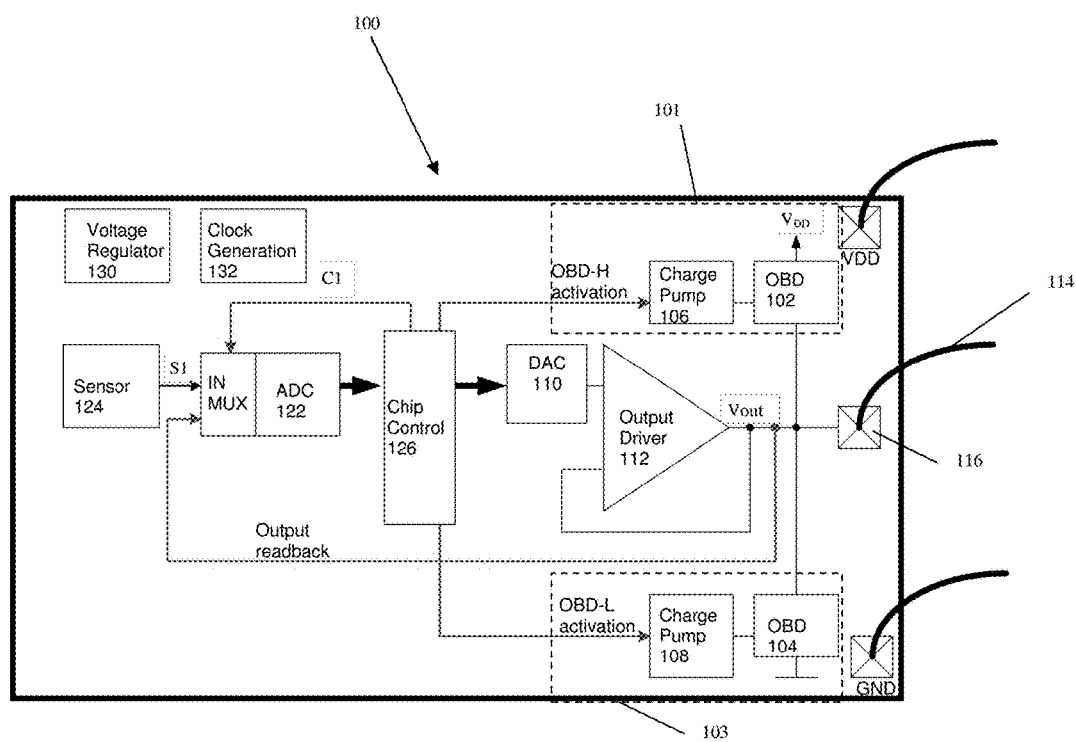
FIG. 1 is a perspective view of a simplified block diagram of a sensor system implementing OBD circuits and where the analog output signal is readback and measured at a main ADC according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to integrated circuit systems and methods, such as sensor systems, comprising on-board-diagnostic (OBD) circuits used in the detection of errors presenting internal to the system. For example, in one embodiment, OBD circuits can be used in detection of errors occurring within an output driver portion of the system. In one embodiment, an ADC multiplexer receives analog output signal of the system, digitizes the analog signal, and provides the digitized signal to a control circuit. The control circuit compares the digitized signal with a value, such as an expected output signal, range of signals or some other value, and provides a signal to an OBD circuit if an error is detected. Within the OBD circuit, a charge pump is deactivated which closes an OBD switch to provide, at the output of the system, a diagnostic output indicative of an error. This error indication can be carried out independently of digital-to-analog converters (DAC) and output drivers, which can be points of failure within the system. Thus, errors within these and other internal system components and operations can be detected and communicated external to the system via one or more OBD circuits.

In an embodiment, an integrated circuit (IC) system, such as a sensor system, can comprise at least one OBD circuit, each OBD circuit comprising a charge pump and a switch. In embodiments, the switch comprises a transistor, such as a depletion transistor, for example a MOSFET. The IC system further comprises an output driver, an ADC multiplexer, and chip control circuitry in an embodiment. At least one of the OBD circuits is coupled to a terminal for a positive supply potential, $V_{DD}$, and at least one of the OBD circuits is coupled to a terminal for a negative supply potential or reference-ground potential, GND.

The output driver outputs an analog output signal, $V_{out}$, which can be read back by the ADC in an embodiment. The ADC output is coupled to chip control circuitry, which is in turn coupled to the charge pump(s) of the at least one OBD circuit. The analog output signal is read back to the ADC multiplexer and analyzed. If output signal $V_{out}$ deviates from a desired value, which can be an expected output value, a preset value or some other value, by more than some limit, the chip control circuitry transmits a signal to the charge pump. The charge pump is then deactivated to close the OBD circuit switch, thereby providing or activating a diagnostic output indicative of an error or other abnormal operational event.

Thus, in embodiments, an error internal to or within the IC system can be detected by analyzing a readback signal of an output signal via an internal ADC. In another embodiment, an external error can be detected by analyzing a readback signal of an output signal via an internal ADC.

FIG. 1 depicts a simplified block diagram of an integrated circuit (IC) system 100 according to an embodiment. IC system 100 comprises a sensor system as depicted but can comprise some other IC system, circuit, chip or device in other embodiments, with reference to an IC system or sensor system herein throughout being merely exemplary of one embodiment and used for discussion purposes. While specific embodiments may be depicted and discussed herein, they are not to be considered limiting with respect to other embodiments and/or the claims. Moreover, many of the depictions herein are generalized for the sake of explanation and convenience, and those skilled in the art will recognize that various electronic elements can be configured and/or coupled differently than the particular examples used for illustration in order to provide other embodiments while still providing the same or similar functionality or features of the embodiment(s) depicted.

IC system 100 comprises a first OBD circuit 101 and a second OBD circuit 103 in an embodiment. First OBD circuit 101 comprises an OBD switch 102 and a charge pump 106 and is coupled between the output $V_{out}$ of the integrated circuit and a terminal for a positive supply potential $V_{DD}$. Second OBD circuit 103 comprises an OBD switch 104 and a charge pump 108 and is coupled between the output $V_{out}$ of the integrated circuit and a terminal for a negative supply potential or reference-ground potential GND. First OBD circuit 101 therefore may be referred to has a "high" side OBD circuit, while second OBD circuit 103 may be referred to as a "low" side OBD circuit, as depicted and described in this example embodiment. In other embodiments, more or fewer OBD circuits, charge pumps and/or OBD switches can be used.

In embodiments, first and second OBD switches 102 and 104 comprise one or more transistors, for example depletion transistors such as MOSFETS or another suitable transistor type, that can effectively function as switches. Thus, when both switches 102 and 104 are powered by their respective charge pump 106 and 108 and are open, $V_{out}$ is communicated to an output of system 100, and when either charge pump 106 or 108 is deactivated such that the corresponding switch 102 or 104 is closed, a short-circuit is formed between $V_{out}$ and either $V_{DD}$ or GND, respectively.

Sensor system 100 can further comprise a digital-to-analog converter (DAC) 110 coupled to the positive input of an output driver 112. Output signal $V_{out}$ from output driver 112 is coupled to and provides negative feedback control to the negative input of output driver 112. Output signal $V_{out}$ is also provided at the output of system 100 and is connected to the external conductor 114. In an embodiment, connection to external conductor 114 can be made via a pad 116, though pins, leads, contacts, wires or other structures can be used in other embodiments.

In embodiments, system 100 comprises components, couplings and/or functionality which enable detection of internal errors (i.e., errors which occur within system 100). In one embodiment, system 100 comprises an analog-to-digital converter multiplexer (ADC MUX) 122 coupled to output driver 112 of system 100 and configured to receive or readback analog output signal $V_{out}$. In embodiments, ADC MUX 122 can comprise a combined ADC and multiplexer, or in other embodiments can comprise a distinct ADC and a distinct multiplexer, or some other suitable device and/or configuration. Inputs of ADC MUX 122 are coupled to, e.g., a sensor 124 and a chip control or state machine 126, as well as to output driver 112. In embodiments, sensor 124 can comprise any desired sensor(s), for example, one or more of an acceleration sensor, temperature sensor, moisture sensor, pressure sensor, optical sensor, magnetic field sensor, or other suitable sensor. State machine or chip control 126 can be coupled to charge pumps 106, 108 and DAC 110. In embodiments, various other circuit elements, such as a microprocessor, can be coupled to the output of the ADC 122 to receive and compare the signal output by the ADC 122.

In embodiments, system 100 can further comprise voltage supplies or regulators 130 and/or clock generators 132 that can be coupled to various other components as understood by those skilled in the art. The embodiment as depicted in FIG. 1 does not show such couplings for simplification. Those skilled in the art will recognize that other components, couplings and features not specifically depicted or discussed can be incorporated in system 100 in these or other embodiments, with the particular depiction in FIG. 1 being merely one simplified example.

In operation, a sensor signal S1 is generated by sensor 124. In normal operation, signal S1 propagates through system 100 such that an output signal $V_{out}$ is provided via bond pad 116. In embodiments, and to determine whether any error has occurred within system 100 that could affect the accuracy or reliability of $V_{out}$, analog output signal $V_{out}$ is communicated or read back to ADC multiplexer 122. An appropriate chip control signal C1 also is provided to ADC MUX 122 by chip control circuitry 126 in embodiments. Analog output signal $V_{out}$ is digitized at ADC MUX 122, and this digitized signal is then transmitted to chip control circuitry 126 for comparison or evaluation.

In one embodiment, the comparison of the read-back and digitized $V_{out}$ can be with a pre-set desired value or range maintained in a memory portion of chip control circuitry 126. In another embodiment, the comparison can be to an actual value, such as to the original digitized signal S1 maintained in a memory portion of chip control circuitry 126. In other embodiments, comparison can be to a standard value, a conventional value, or some other signal, value or range. In an embodiment, chip control circuitry 126 compares these values, and if the read-back digitized signal deviates from a pre-set desired value, such as at all or by more than a given predefined limit (e.g. by at least about 10%, such as by at least about 25%, for example by at least about 30% in an embodiment, or by some value or range set by an OEM or other implementer of system 100 and maintained in EEPROM or other memory of system 100 or elsewhere, etc.) in various embodiments, chip control circuitry 126 transmits a signal to the appropriate charge pump 106, 108 to deactivate that charge pump 106, 108. In other embodiments, the values can be compared to a predetermined value or range, such as within a range of about 10% to about 90% of $V_{DD}$ in embodiments.

Deactivating a charge pump 106 or 108 has the effect of activating OBD circuit 102 or 104, respectively. As previously discussed, in embodiments OBD switches 102, 104 comprise transistors or other circuits or elements which are normally open when powered by charge pumps 106, 108. These switches 102, 104 can be activated (e.g., closed) by deactivating the corresponding charge pump 106, 108. Activating either OBD circuit 102, 104 results in provision of the corresponding diagnostic output, $V_{DD}$ or GND, at the output of system 100. In an embodiment, one or the other of OBD circuits 102, 104 is activated at any time, though in other embodiments the second OBD circuit 102, 104 also can be activated, such as based on chip control 126 operations.

Either of these outputs diagnostic outputs, $V_{DD}$ or GND, being outside of the expected normal output signal range of system 100, could indicate an error when provided to or received by an electronic control unit (ECU), microprocessor or other device or system coupled to system 100 by, e.g., bond pad 116 and conductor 114. The ECU or other circuitry or device then can take appropriate action, such as providing an alert to an operator or user, disabling system 100 or some other system or component coupled thereto, activating a fail-safe routine, or implementing some other process or procedure. Thus, in an embodiment, an internal error, for example, of DAC 110 or output driver 112, can be detected by reading back and digitizing output signal $V_{out}$ and then comparing this digitized signal at a control unit. Deviation of output signal $V_{out}$ by a certain predefined limit and/or from an expected value triggers a diagnostic output via at least one OBD circuit 102, 104 by deactivating the associated charge pump 106, 108. OBD circuits 102, 104 also can detect external errors, with the detection of internal errors not fundamentally affecting or altering their original use or implementation in embodiments.

Figure 2:
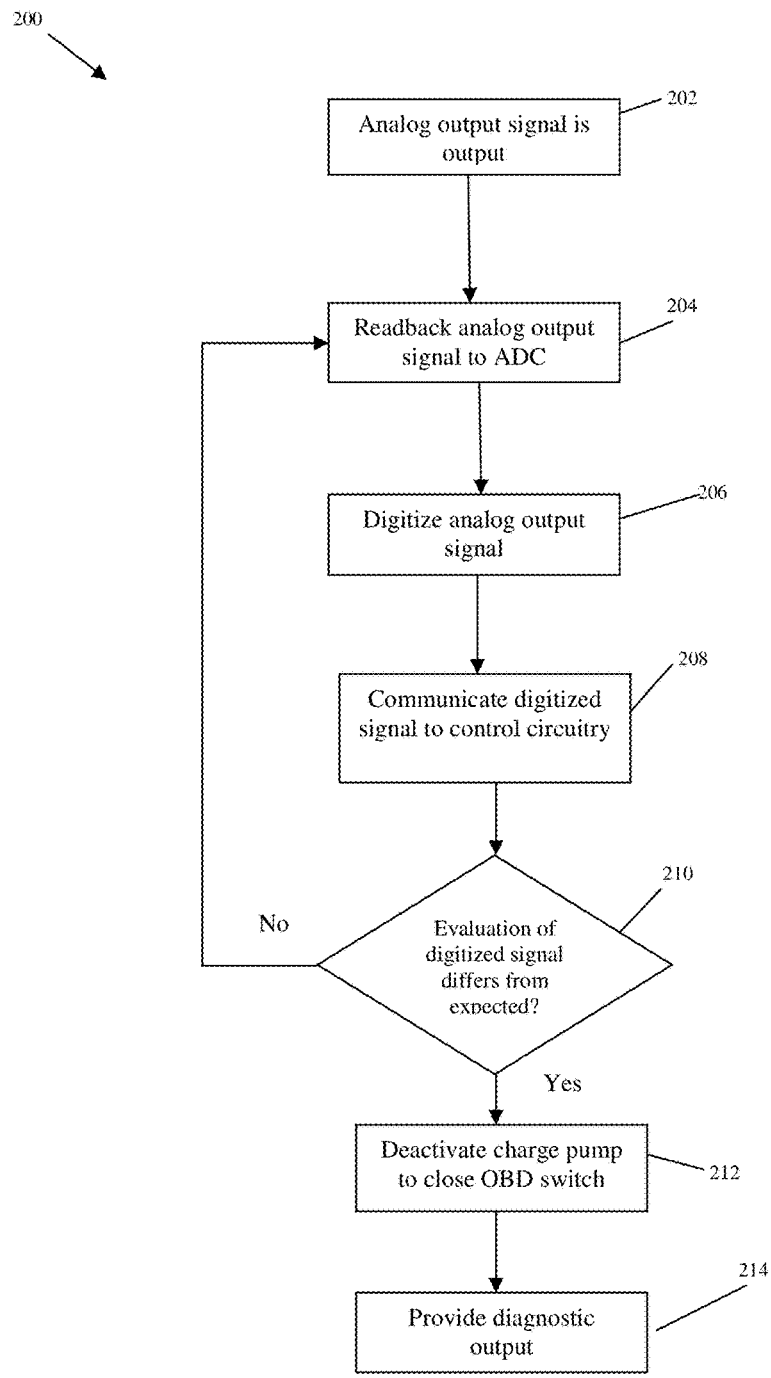
FIG. 2 is a flowchart that details the method of determining an internal fault in a sensor system according to an embodiment.

FIG. 2 illustrates one embodiment of a method 200 of detecting errors internal to a sensor system like system 100 of FIG. 1 or other systems discussed herein. Those skilled in the art will appreciate that method 200 can include additional steps and sequences and can emit one or more steps or sequences depicted, in various embodiments. At 202, an analog output signal is output, such as by output driver 112 or some other circuit or system component. The analog output signal is read-back or otherwise communicated to an internal ADC at 204, and the ADC converts the analog signal to a digital signal at 206. In embodiments, the analog-to-digital conversion can be omitted if a digital signal is output, which can be the case in embodiments, or the analog-to-digital conversion can be carried out in another way. At 208 the digital signal is communicated to control circuitry which determines, at 210, whether an error has occurred by evaluating or comparing the digital signal with a reference, actual or predetermined value or range, as previously discussed. If the result of 210 is indicative of an error internal to the system ("Yes"), a charge pump is deactivated at 212 such that OBD switch circuit is closed in order to provide a diagnostic output at 214. If the result of 210 is not indicative of an error ("No"), then normal operation can continue, which can include returning to 204 to read back additional output signals for comparison in a similar way.

In embodiments, the read-back and comparison can occur at start-up, periodically, for each output signal or at some other frequency, which can vary according to user preference, system function, relevant safety standard, sensor operation or performance, or some other factor(s). Method 200 also can be interrupted if, for example, an external error is detected by the on-board diagnostic circuits, a result of which could be an interruption of normal operation.

Figure 3:
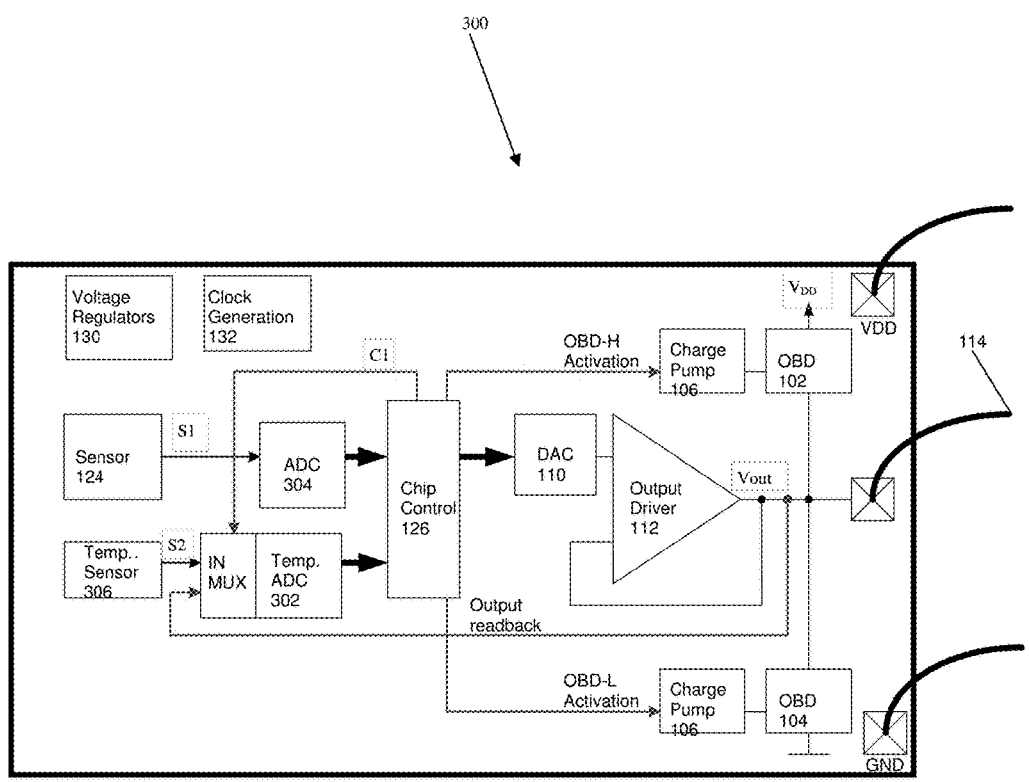
FIG. 3 is a perspective view of a simplified block diagram of a sensor system where the analog output signal is readback and measured via the on-chip temperature ADC according to an embodiment.

FIG. 3 depicts another embodiment of an IC system 300, such as a sensor system which comprises a second sensor 306 in an embodiment. While a temperature sensor is depicted in FIG. 3, as is often common in sensor systems, some other sensor(s) can be implemented in other embodiments, as discussed herein above with respect to the embodiment of FIG. 1. Unless otherwise specifically discussed or identified, components, features and general operation of system 300 is similar to that of system 100. In system 300, sensor 124 is coupled to an ADC 304 while sensor 306 is coupled to ADC MUX 302, such that each sensor 124 and 306 has its own signal path to chip control circuitry 126. Such a configuration can be advantageous if sensors 124 and 306 have different sampling rates, such as in the example of a temperature sensor 306, which can be slower-changing than sensor 124.

In operation, system 300 is similar to system 100 discussed above. ADC 304 receives sensor signal S1 from sensor 124 and provides a signal to chip control 126. Sensor signal S1, chip control signal C1 and analog output signal $V_{out}$ are provided to temperature ADC multiplexer 302 in an embodiment. In other embodiments, ADC 304 and ADC MUX 302 can be interchanged or replaced by a single ADC MUX. Analog output signal $V_{out}$ is read back or otherwise communicated to and digitized at temperature ADC MUX 302, then transmitted to chip control circuitry 126 for comparison to, e.g., a pre-set desired value, an actual or expected value, a reference value or range or some other quantity. If the comparison fails, e.g., the digitized signal deviates from the pre-set desired value by more than a given predefined limit or is out of range in embodiments, chip control circuitry 126 transmits a signal to at least one charge pump 106, 108 to disable that charge pump, which in turn causes the corresponding OBD switch 102 or 104, respectively, to close and form a short circuit between $V_{DD}$ or GND, respectively, and the output of system 300.

In an embodiment related to either FIG. 1 or FIG. 3 and for further diagnostic and safety integrity purposes, an error can be forced in order to observe if the output voltage $V_{out}$ reaches the same value as when the OBD 102, 104 is active. This can, for example, attempt to identify any errors that could be associated with OBDs 102, 104 themselves and thereby provide further diagnostic coverage within system 100 or 300. Another embodiment comprises pulling or pushing the analog output from the desired analog output value to verify that the safety mechanism reacts by activating the diagnostic output of the OBD circuit 102, 104. These and other additional diagnostics can be carried out, for example, by chip control circuitry 126, such as at start-up, or can be initiated external to system 100 or 300, for example by an ECU.

In another embodiment, an external error, for example, a line interruption, can be detected by reading back of output signal $V_{out}$ via an internal DAC 110, as some line interruptions can affect $V_{out}$ or other internal components of system 100 or 300. Detecting internal effects of these external errors can help to prevent damage to system 100 or 300 as well as to identify external errors that might not otherwise be detected or detectable or could otherwise have adverse impacts. In the event of an external line interruption, the output signal $V_{out}$ is pulled in the direction of the faulty drift. For example, if drifting high, the output signal $V_{out}$ is pulled to $V_{DD}$, similar to the diagnostic output provided if charge pump 106 was deactivated and OBD switch 102 closed to form a short circuit between $V_{DD}$ and the output of system 100 or 300, such that an error can be detected. Deviation of output signal $V_{out}$ by a certain predefined limit activates at least one diagnostic output by deactivating the charge pump 106, 108 to close the corresponding OBD switch 102, 104. In an embodiment, other types of external faults can be detected in addition to a line interruption or conductor break. The evaluation of $V_{out}$ thus can also take into account effects thereon by internal and/or external events.

In another embodiment, a transitory or short-lived error can be detected by operating OBD circuits 101 and 103 in a polling-like manner, just as by deactivating (and in case of a persistent error, activating) one or both of circuits 101 and 103 periodically to in order to detect transitory or periodic errors which may come and go. Some transitory errors, though short-lived, can still cause damage to system 100 or 300 or other components or otherwise interfere with normal system operation, such that detecting these errors can be advantageous. Detecting these errors, however, can be difficult because they are, by their nature, transitory and may cause sporadic but difficult to isolate problems. In embodiments, however, OBD circuits 101 and/or 103 can be disabled if an error is detected or suspected, and $V_{out}$ can be monitored to see whether it returns to normal. Such an operation may also serve to isolate possible sources of transitory faults. If output signal $V_{out}$ returns to normal, then normal operation of OBD circuits 101 and 103 can be reinstated.

Other embodiments can incorporate a dual-die concept or a dual datapath concept. Thus, while embodiments depicted herein can comprise a single die and/or integrated circuit, dual- or multi-die embodiments also can be implemented. Additionally, the data path, such as for sensors 124 and 306 in FIG. 3, can be made more distinct in other embodiments, or additional circuitry and signal transmission paths can be implemented. For example, each OBD circuit 101 and 103 can have its own signal read-back and evaluation path in one embodiment, or redundancy can be implemented. While these embodiments can be associated with increased costs, they also can be desired in safety-critical or ultra-high integrity systems.

In another embodiment, sensor system 100 or 300 can be provided with an additional output pin to indicate any malfunction. For example, a separate die pad, pin or other output contact can be provided to provide a single error signal or a parallel error signal with $V_{out}$ in embodiments. This can be useful, for example, for a second check of the $V_{out}$ in an error situation by, e.g., an ECU or other external component. Still other embodiments can provide additional components and features. For example, in one embodiment, safety status signaling can be accomplished via an additional load transistor modulating the power supply by using additional circuits and components, as appreciated by those skilled in the art.

Embodiments of sensor systems as described herein can comprise interconnected electronic components that perform specific functions upon application of voltages and signals. These functions generally are known to those skilled in the art. Embodiments as described herein can comprise more or fewer of the components as depicted and/or described. For ease of discussion, various other circuit elements are not shown but could be incorporated, for example, one or more of diodes, resistors, capacitors, switches, transistors, traces, couplings, connectors, pads, and combinations thereof. However, it is apparent to one with skill in the art that, in embodiments, various other circuit elements would be advantageous.

Embodiments of sensor system components are described herein as being "coupled." One skilled in the art would understand that "coupled" indicates an operative association between components where the components interact with each other and are sending voltages, signals, or the like back and forth. As such, components can be indirectly coupled or directly coupled. Embodiments of indirectly coupled components can have one or more components or circuit elements in the coupling pathway between the components. Embodiments of directly coupled components are connected with no components or circuit elements in the coupling pathway between the components. Unless specifically mentioned, components generally are considered to be indirectly coupled. Embodiments described herein are not limited to being housed on a single printed circuit board or within a single chip.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. An integrated circuit system comprising:
   at least one on-board diagnostic circuit comprising a switch coupled between an output and a first potential;
   an output driver configured to provide a system output signal at the output; and
   a control unit coupled to the at least one on-board diagnostic circuit and configured to compare the system output signal with a value and to provide an error output signal via the at least one on-board diagnostic circuit when the comparison indicates an error.

2. The integrated circuit system of claim 1, wherein the error is internal to the sensor system.

3. The integrated circuit system of claim 1, wherein the error is external to the sensor system.

4. The integrated circuit system of claim 1, wherein the value is one of a predetermined value or a predetermined range of values.

5. The integrated circuit system of claim 1, further comprising a digital-to-analog converter coupled to a positive input of the output driver and the control circuit.

6. The integrated circuit system of claim 1, wherein the at least one on-board diagnostic circuit comprises at least one charge pump coupled to the switch and to the control unit.

7. The integrated circuit system of claim 6, wherein the control unit is configured to turn off the at least one charge pump to close the switch and form a short circuit between the first potential and the output of the sensor system, such that the error output signal comprises the first potential, when the comparison indicates an error.

8. The integrated circuit system of claim 1, wherein the switch comprises at least one transistor.

9. The integrated circuit system of claim 8, wherein the at least one transistor comprises a depletion MOSFET.

10. The integrated circuit system of claim 1, further comprising:
    an analog-to-digital converter coupled to the output driver and configured to receive the system output signal and convert the system output signal to a digital signal before providing the digital signal to the control unit.

11. The integrated circuit system of claim 10, wherein the value comprise a digital value.

12. The integrated circuit system of claim 10, wherein the analog-to-digital converter comprises an analog-to-digital converter multiplexer.

13. The integrated circuit system of claim 12, further comprising at least one sensor coupled to the analog-to-digital converter multiplexer, wherein the system output signal is related to a signal generated by the at least one sensor.

14. The integrated circuit system of claim 13, wherein the value is related to the signal generated by the at least one sensor.

15. The integrated circuit system of claim 13, wherein the at least one sensor comprises a primary sensor and a secondary sensor, wherein the analog-to-digital converter multiplexer is coupled to the secondary sensor and an analog-to-digital converter is coupled to the primary sensor.

16. The integrated circuit system of claim 15, wherein the primary sensor comprises one of a temperature sensor, a pressure sensor, a magnetic field sensor, a moisture sensor, or an acceleration sensor.

17. The integrated circuit system of claim 16, wherein the secondary sensor comprises one of a temperature sensor, a pressure sensor, a magnetic field sensor, a moisture sensor, or an acceleration sensor.

18. A method of detecting errors internal to an integrated circuit system comprising:
    providing an output signal of the system to an internal control circuit of the system;
    comparing the output signal to a value; and
    providing an error signal indicative of an error internal to the system via an on-board-diagnostic circuit if the comparing deviates from the value by a predefined limit, wherein providing the error signal further comprises deactivating a charge pump of the on-board-diagnostic circuit to close a switch of the on-board-diagnostic circuit to provide the error signal indicative of an error internal to the system via the closed switch.

19. The method of claim 18, wherein the output signal is an analog output signal, and the method further comprises digitizing the analog output signal before the comparing.

20. The method of claim 19, wherein comparing the output signal with the value comprises evaluating the digitized output signal with the value, wherein the value includes a predetermined range of values.

* * * * *